United States Patent [19]

Sugiura

[11] Patent Number: 4,646,383

[45] Date of Patent: Mar. 3, 1987

[54] SYNTHETIC RESIN SPACER FOR CONNECTING PARALLEL PLATES AT PREDETERMINED SPACE

[75] Inventor: Haruyuki Sugiura, Kariya, Japan

[73] Assignee: Kitagawa Industries Co., Ltd., Nagoya, Japan

[21] Appl. No.: 751,307

[22] Filed: Jul. 2, 1985

[30] Foreign Application Priority Data

Sep. 10, 1984 [JP] Japan ............................ 59-137779[U]

[51] Int. Cl.$^4$ ............................................... E05D 1/02
[52] U.S. Cl. ........................................ 16/225; 16/321; 16/366; 16/DIG. 13; 339/4; 339/17 M; 339/17 LM
[58] Field of Search ................. 16/225, 321, 333, 366, 16/385, DIG. 13; 339/4, 17 M, 17 LM

[56] References Cited

U.S. PATENT DOCUMENTS 2,633,380  3/1953  Shapiro ............................ 16/366 X
3,701,071 10/1972  Landman ................................ 339/4

FOREIGN PATENT DOCUMENTS 3230618 2/1984 Fed. Rep. of Germany ........ 16/225
3337413 4/1984 Fed. Rep. of Germany .... 16/DIG. 13 X Primary Examiner—Fred Silverberg
Attorney, Agent, or Firm—Oblon, Fisher, Spivak, McClelland & Maier

[57] ABSTRACT

In a synthetic resin spacer having two mounting portion (1, 2) for connecting plates (10A, 15) in spaced and parallel relation to each other, one mounting portion (1) is formed integrally with the other mounting portion (2) pivotably through a hinge portion (3); the other mounting portion (2) is provided with a vertical frame (11) which is perpendicular to the plate (10A) connected to the mounting portion (2); and the vertical frame (11) is provided on the side of the hinge portion (3) with an engaging projection (11a) which is engageble with and disengageable from a side edge of the plate (15) connected to one mounting portion (1). With such construction, the two plates can be connected firmly, and the repair or maintenance and inspection of electronic parts on the plates can be done extremely easily.

7 Claims, 10 Drawing Figures

SYNTHETIC RESIN SPACER FOR CONNECTING PARALLEL PLATES AT PREDETERMINED SPACE

BACKGROUND OF THE INVENTION (1) Field of Art

The present invention relates to a synthetic resin spacer employable for supporting printed circuit boards or the like in electronic devices, etc.

(2) Prior Art

According to the prior art, in mounting printed circuit boards used in an electronic device or the like horizontally on a chassis at a predetermined space, each printed circuit board is mounted on the chassis by means of a supporting rod using a spacer or the like. However, since the printed circuit boards are stacked horizontally in spaced relation, it is necessary to remove the boards at the time of component replacement for repair or maintenance and inspection. But, this is troublesome. In order to facilitate repair and inspection, there has been proposed a structure in which printed circuit boards mounted horizontally on a chassis are each supported with a hinge so that, they can be pivoted up to a vertical position at the time of repair. However, with an ordinary type of a hinge, the printed circuit board supported thereby cannot be locked in an approximately vertical position on the chassis, thus requiring a worker to hold the board by hand during repair. Due to such a working condition, it is impossible to easily perform replacement of electronic parts, etc.

SUMMARY OF THE INVENTION

It is an object of the present invention to provide a spacer for connecting two plates firmly in parallel at a predetermined space.

It is another object of the present invention to provide a spacer whereby one plate can be moved in its vertical direction from its connected position automatically by an urging force while keeping its horizontal state.

It is a further object of the present invention to provide a synthetic resin spacer which when attached to a chassis of an electronic device containing printed circuit boards, permits a printed circuit board mounted horizontally on the chassis to rise and come near the worker's hand at the time of repair or maintenance and inspection, thus facilitating replacement of parts and other operations.

It is still a further object of the present invention to provide a spacer which permits a printed circuit board to rise horizontally even during movement, for example in an assembly line operation for the assembly of electronic devices and therefore permits production and repair while avoiding contact with other parts.

According to the present invention, in order to achieve the above-mentioned objects, in a synthetic resin spacer having two mounting portions for connecting plates in spaced and parallel relation to each other, one mounting portion is formed integrally with the other mounting portion pivotably through a hinge portion. The other mounting portion is provided with a vertical frame which is perpendicular to the plate connected to the mounting portion. The vertical frame is provided on the side of the hinge portion with an engaging projection which is engageable with and disengageable from a side edge of the plate connected to one mounting portion.

DETAILED DESCRIPTION OF A PREFERRED EMBODIMENT

An embodiment of the present invention will be described hereinunder with reference to the drawings.

Figure 1:
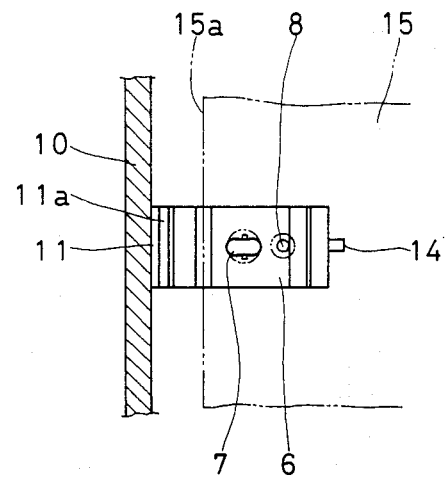
FIG. 1 is a plan view with a printed circuit board removed from a chassis.
Figure 2:
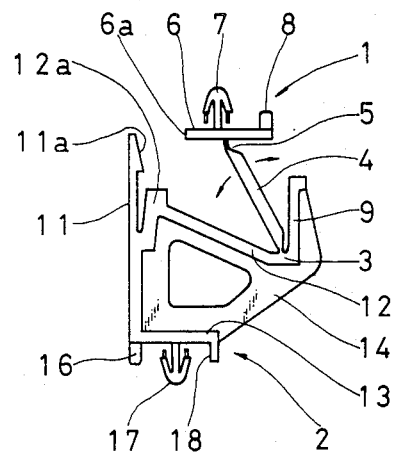
FIG. 2 is a front view of a spacer embodying the invention.
Figure 3:
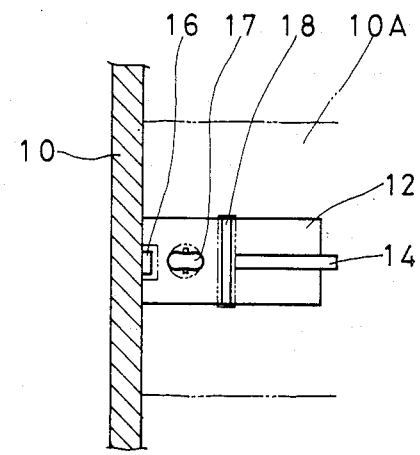
FIG. 3 is a bottom view with another printed circuit board connected to the chassis.
Figure 4:
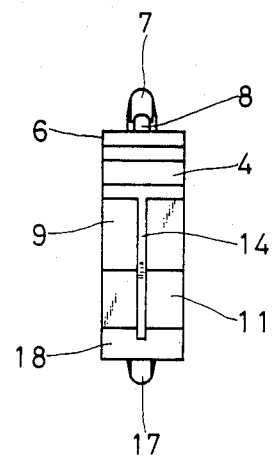
FIG. 4 is a right side view thereof.
Figure 5:
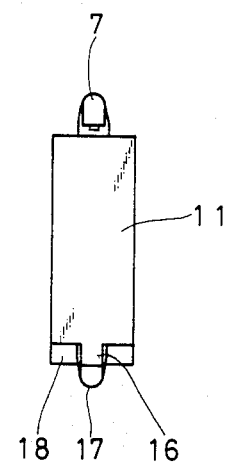
FIG. 5 is a left side view thereof.
Figure 6:
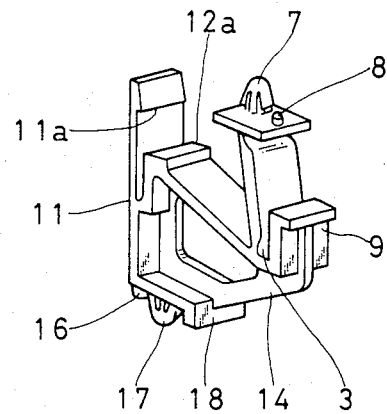
FIG. 6 is a perspective view of the spacer.
Figure 7:
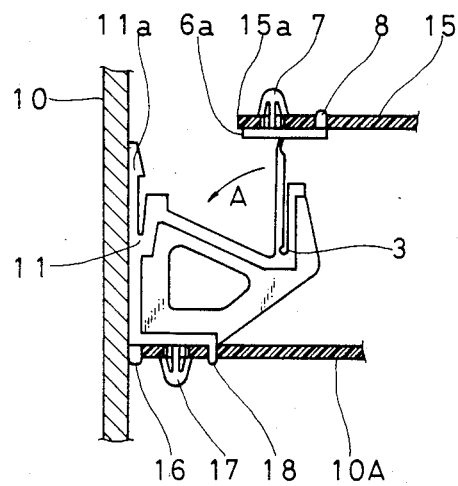
FIG. 7 is a partially sectional front view showing a state in which a printed circuit board is about to be attached perpendicularly to the chassis.
Figure 8:
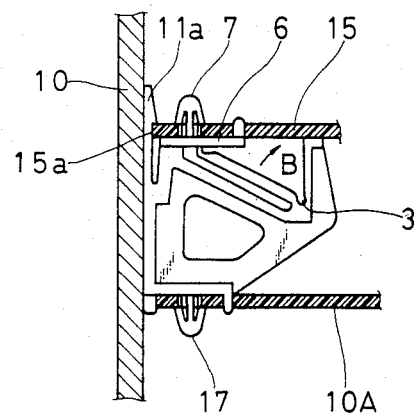
FIG. 8 is a partially sectional front view showing a state in which the printed circuit board is about to be disengaged from the chassis.

FIGS. 1, 2, 3, 4 and 5 are a plan view of a synthetic resin spacer, a front view thereof, a bottom view thereof, a right side view thereof and a left side view thereof, respectively. This synthetic resin spacer, as shown in FIG. 2, has a thin-walled first hinge portion 3, and upper and lower mounting portions 1 and 2 formed integrally through the hinge portion 3 so as to permit a pivotal movement in the directions indicated by arrows. The spacer is formed of a synthetic resin such as nylon or polypropylene. The upper mounting portion 1 comprises a thick-walled portion 4 which is contiguous to the hinge portion 3 and a flat plate portion 6 which is contiguous to the thick-walled portion 4 through a second hinge portion 5 and whose upper surface comes into contact with and supports the back of a printed circuit board 15 or the like as shown in FIGS. 7 and 8. Further, on the flat plate portion 6 are integrally formed an umbrella-like projection 7 and a boss 8 adapted to be inserted and connected into a mounting hole formed in the printed circuit board 15 or the like. The lower mounting portion 2 comprises a second inner frame 9, a vertical frame 11 which is in contact with a side chassis 10, an inclined frame 12 which connects the frames 9 and 11, a lower frame 13 extending horizontally from a lower end of the vertical frame 11, and a reinforcing rib 14 positioned centrally on the width of these frames formed integrally. On the inner surface of an upper end of the vertical frame 11 is formed an engaging projection 11a adapted to engage a side edge 15a of the printed circuit board 15 or the like fixed to the upper mounting portion 1. A first inner frame 12a is projected from the vertical frame 11 side of the inclined frame 12. Further, on the back of the lower frame 2 are integrally formed a projection 16 adapted to engage a notched edge formed in a mounting position of a horizontal surface of a chassis 10A, an umbrella-like projection 17 and a projection 18, the projections 17 and 18 being inserted and connected into a mounting hole and a mounting ellipse hole respectively formed on the horizontal surface of the chassis 10 or the like.

The synthetic resin spacer thus formed is used for holding, for example, a printed circuit board housed in the chassis of an electronic device so that the board can be moved obliquely upward from its mounted position, as shown in FIG. 7. In this case, it is assumed that on the horizontal surface of the chassis 10A are formed in advance a notched edge for engagement with the projection 16 of the lower mounting portion 2, a mounting hole for insertion and connecting therein of the umbrella-like projection 17, and a mounting ellispe hole for insertion and connecting therein of the projection 18. The projections 16, 17 and 18 are fitted in those notched edge and mounting holes and thereby connected to the back of the lower frame 13. The vertical frame 11 is connected to the side chassis 10 through a strong adhesive applied to its outer surface which is in contact with the side chassis. The printed circuit board 15 is beforehand formed with mounting holes for insertion and connecting therein of the umbrella-like projection 7 and the boss 8 respectively on the flat plate portion 6 of the upper mounting portion 1, the projection 7 and the boss 8 being inserted therein from the back side of the board 15. It is assumed that those mounting holes are formed so that a side edge 15a of the printed circuit board 15 protrudes slightly from a side edge 6a of the flat plate portion 6. The umbrella-like projection 7 and boss 8 on the flat plate portion 6 of the upper mounting portion 1 are fitted in those mounting holes and fixed on the surface of the flat plate portion 6.

Figure 9:
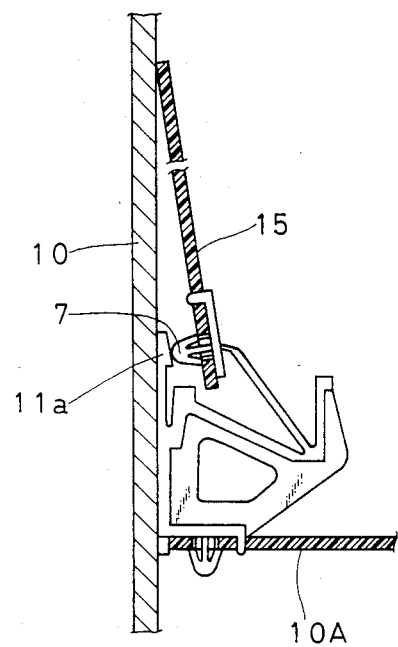
FIG. 9 is a partially sectional front view showing a state in which a printed circuit board has risen and leans against a chassis.
Figure 10:
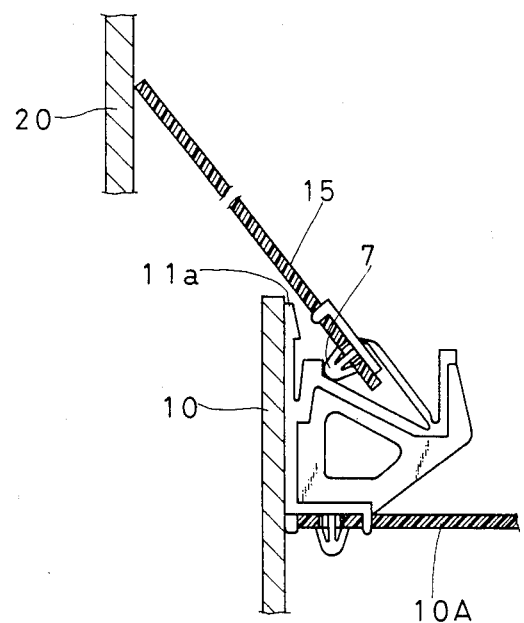
FIG. 10 is a partially sectional front view showing a state in which the printed circuit board has risen and leans against another chassis.

The side edge 15a of the printed circuit board 15 is brought into engagement with the engaging projection 11a of the vertical frame 11 as shown in FIG. 8 by pushing the upper mounting portion 1 in the direction of arrow A in FIG. 7 while allowing the first hinge portion 3 to serve as a fulcrum. During this movement, the flat plate portion 6 pivots horizontally while allowing the second hinge portion 5 to serve as a fulcrum, so that the printed circuit board 15 is held in a horizontal state. The flat plate portion 6 is supported by the inner frame 12a, and the printed circuit board 15 is supported also by the inner frame 9. In this way, the printed circuit board 15 is connected in parallel with and at a predetermined space from the horizontal surface of the chassis 10A.

Where it is necessary to repair a trouble, or for maintenance and inspection, the engaging projection 11a of the vertical frame 11 and the side edge 15a of the printed circuit board 15 are disengaged from each other by pushing the side chassis 10 outward, thus allowing the upper mounting portion 1 to move and rise in the direction of arrow B in FIG. 8, namely, obliquely upward, so that the printed circuit board 15 reverts to its original horizontal state before the engagement as shown in FIG. 7. After allowing the printed circuit board 15 to assume the state shown in FIG. 7, it is also possible to bring it into such a state as shown in FIG. 9 in which the board 15 leans against the chassis 10, by pivoting the board while allowing the hinge portion 5 to serve as a fulcrum and supporting the umbrella-like projection 7 by the engaging projection 11a. Further, where the side chassis 10 is low, the printed circuit board 15 can be allowed to lean against another side chassis 20. In this case, the umbrella-like projection 7 is supported by the inclined frame 12 and the inner frame 12a.

What is claimed is:

1. A spacer for connecting first and second plates in spaced and parallel relation to each other, said spacer comprising:
   having first means for mounting said first plate thereon;
   a second mounting portion having means for connecting to said second plate at one end thereof;
   means for connecting said first and second mounting portions for pivoting about two spaced axes, said means for connecting comprising a long thick walled portion having a first thin walled hinge portion at one end for pivotally connecting said thick walled portion to said first mounting portion, and a second thin walled portion at an opposite end of said thick walled portion for pivotally connecting said thick walled portion to said second mounting portion; and
   a vertical frame unitarily connected to said second mounting portion and provided at an angle to said second plate, the vertical frame having an engaging projection formed at a free end thereof,
   wherein said first mounting portion with said first plate mounted thereon can pivot about the first and second hinge portions until only a side edge of said first plate comes into direct engagement with said engaging projection, to thereby connect said plates in spaced and parallel relation to each other, said first mounting means being connected to said first plate at one end thereof, wherein said one end is located at the side edge that comes into direct engagement with said engaging projection,
   and wherein upon said side edge of said first plate being disengaged from said engaging projection, said first mounting portion can pivot about said first and second hinge portions until said first means for mounting comes into direct engagement with said engaging projection to thereby support said first plate in an open position.

2. A spacer according to claim 1, wherein the second mounting portion has a lower frame provided at an angle to the vertical frame, an inclined frame which is inclined at an angle to the first plate, a first inner frame which connects the inclined frame and the vertical frame and which extends from one end of the inclined frame toward the first plate, a second inner frame which extends from the outer end of the inclined frame toward the first plate, and a rib which connects with and reinforces the vertical frame, said inclined frame, said first and second inner frames, and said lower frame; wherein the thin-walled hinge portion connects with the other end of the inclined frame and supports the first mounting portion; and wherein said second inner frame has a length sufficient that the back of said first plate may be partially supported by the inner frame.

3. A spacer according to claim 2, wherein the means for connecting to said second plate comprises an umbrella-like projection extending from the surface of the lower frame toward the second plate, further including a first projection formed on the side of the vertical frame and a second projection formed at an end of the lower frame opposite the side where the first projection is provided.

4. A spacer according to claim 2, wherein one face of the vertical frame is connected to a chassis as the connecting plate.

5. A spacer according to claim 2, integrally formed of a synthetic resin.

6. A spacer according to claim 1, wherein the first mounting portion comprises a flat plate portion and wherein said first means for mounting comprise an umbrella-like projection extending from the flat plate portion toward the first plate, and a boss formed on the surface of the flat plate portion.

7. A spacer according to claim 6 or claim 4, wherein each said umbrella-like projection is adapted to expand to connect one of said plates after insertion thereof into a mounting hole formed in said one of said plates.

* * * * *